(12) United States Patent
Milligan et al.

(10) Patent No.: US 9,571,008 B2
(45) Date of Patent: Feb. 14, 2017

(54) OUT-OF PLANE TRAVEL RESTRICTION STRUCTURES

(75) Inventors: Donald J. Milligan, Corvallis, OR (US); Rodney L. Alley, Albany, OR (US); Peter G. Hartwell, Sunnyvale, CA (US); Robert G. Walmsley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 792 days.

(21) Appl. No.: 14/112,091

(22) PCT Filed: Jun. 28, 2011

(86) PCT No.: PCT/US2011/042175
§ 371 (c)(1),
(2), (4) Date: Oct. 16, 2013

(87) PCT Pub. No.: WO2013/002767
PCT Pub. Date: Jan. 3, 2013

(65) Prior Publication Data
US 2014/0042869 A1   Feb. 13, 2014

(51) Int. Cl.
*H01L 29/84* (2006.01)
*H02N 1/00* (2006.01)
(Continued)

(52) U.S. Cl.
CPC ............... *H02N 1/00* (2013.01); *B81B 3/0051* (2013.01); *B81B 3/0054* (2013.01);
(Continued)

(58) Field of Classification Search
CPC ...... H01L 29/84; B81B 3/0051; B81B 3/0054; H01H 3/60
See application file for complete search history.

(56) References Cited

U.S. PATENT DOCUMENTS 7,036,374 B2   5/2006   Pike et al.
7,069,789 B2   7/2006   Tokunaga et al.
(Continued)

FOREIGN PATENT DOCUMENTS

CN    1856440 A    11/2006
CN   101004478 A    7/2007
(Continued)

*Primary Examiner* — Amar Movva
(74) *Attorney, Agent, or Firm* — HP Inc. Patent Department (57) ABSTRACT

The present disclosure includes structures and methods of forming structures for restricting out-of-plane travel. One example of forming such structures includes providing a first wafer 100, 220 comprising a bond layer of a particular thickness 101, 221 on a surface of a substrate material 105, 225, removing the bond layer 101, 221 in a first area 103-1, 103-2, 223 to expose the surface of the substrate material 105, 225, applying a mask to at least a portion of a remaining bond layer 109-1, 109-4, 229-1, 229-3 and a portion of the exposed surface of the substrate material in the first area 109-2, 109-3, 229-2 to form a second area exposed on the surface of the substrate material 105, 225, etching the second area to form a cavity 110, 230 in the substrate material 105, 225 and the bond layer 101, 221, and forming by the etching, in the cavity 110, 230, a structure 113-1, 113-2, 233 for restricting out-of-plane travel, where the structure 113-1, 113-2, 233 has a particular height from a bottom of the cavity 115, 235 determined by the particular thickness of the bond layer 101, 221.

15 Claims, 3 Drawing Sheets

(51) Int. Cl.
  *B81B 3/00* (2006.01)
  *H01H 3/60* (2006.01)
  *B81C 1/00* (2006.01)
  *G01P 15/08* (2006.01)

(52) U.S. Cl.
  CPC ........... *B81C 1/00388* (2013.01); *H01H 3/60* (2013.01); *H01L 29/84* (2013.01); *B81B 2201/0235* (2013.01); *B81B 2203/053* (2013.01); *G01P 2015/0871* (2013.01)

(56) References Cited

U.S. PATENT DOCUMENTS

| | | |
|---|---|---|
| 7,170,140 B2 | 1/2007 | Dutoit et al. |
| 7,318,349 B2 | 1/2008 | Vaganov et al. |
| 7,481,112 B2 | 1/2009 | Kim et al. |
| 7,515,783 B2 | 4/2009 | Kato et al. |
| 7,640,805 B2 | 1/2010 | Diamond et al. |
| 2002/0104379 A1 | 8/2002 | Ried |
| 2002/0168136 A1 | 11/2002 | Atia et al. |
| 2004/0072386 A1 | 4/2004 | Tanabe et al. |
| 2005/0280106 A1 | 12/2005 | Kim et al. |
| 2007/0037310 A1 | 2/2007 | Seto |
| 2007/0128831 A1 | 6/2007 | Oka et al. |
| 2007/0188272 A1 | 8/2007 | Nakamura et al. |
| 2008/0173959 A1 | 7/2008 | Merassi et al. |
| 2008/0224319 A1 | 9/2008 | Nakamura |
| 2008/0314723 A1 | 12/2008 | Liu |
| 2010/0013574 A1 | 1/2010 | Huang |
| 2010/0117166 A1 | 5/2010 | Geiger et al. |
| 2010/0162823 A1 | 7/2010 | Hattori |
| 2010/0242603 A1 | 9/2010 | Miller et al. |
| 2010/0258885 A1 | 10/2010 | Wang et al. |

FOREIGN PATENT DOCUMENTS

| | | |
|---|---|---|
| CN | 101687629 A | 3/2010 |
| EP | 0261972 | 3/1988 |
| EP | 1947053 | 7/2008 |
| WO | WO-2005028359 | 3/2005 |

OUT-OF PLANE TRAVEL RESTRICTION STRUCTURES

BACKGROUND

Microelectromechanical structures (MEMS) include sensors and actuators that can be fabricated using semiconductor processing techniques. Various MEMS devices (e.g., sensors and actuators) include electrostatic, magnetic, and/or other elements (e.g., electrodes) used to effect and/or detect changes in position or separation between surfaces. MEMS sensors and actuators can be formed, for instance, by bonding wafers together. Characteristics of the sensors and actuators, such as sensitivity, reliability, and/or durability, can depend on maintaining a distance between adjacent surfaces, for instance.

DETAILED DESCRIPTION

Out-of-plane travel restriction structures and methods of forming out-of-plane travel restriction structures are described herein. One example of forming an out-of-plane travel restriction structure includes providing a first wafer comprising a bond layer of a particular thickness on a surface of a substrate material and removing the bond layer in a first area to expose the surface of the substrate material. Forming the out-of-plane travel restriction structure includes applying a mask to at least a portion of a remaining bond layer and a portion of the exposed surface of the substrate material in the first area to form a second area exposed on the surface of the substrate material and etching the second area to form a cavity in the substrate material and the bond layer. Accordingly, the structure is formed in the cavity by the etching and the structure has a particular height from a bottom of the cavity determined by the particular thickness of the bond layer.

Examples of the present disclosure can provide various benefits. For instance, such benefits can include preserving sensitivity, reliability, and/or durability of MEMS sensors and actuators by maintaining a distance between adjacent surfaces and/or electrodes associated with the adjacent surfaces. For instance, as described in the present disclosure, the out-of-plane travel restriction structures can reduce likelihood of contact between a proof mass and a stationary wafer of the MEMS and/or electrodes connected to the proof mass and the stationary wafer. Such contact may otherwise result from a displacement of the MEMS, where the displacement has a vector with a z-axis component and the MEMS is designed to determine magnitude of x- and/or y-axis components of the displacement vector.

Additionally, as described in the present disclosure, the out-of-plane travel restriction structures (e.g., z-axis structures such as bumpers, pillars, and/or shoulders, among other such structures) can restrict travel of the proof mass to reduce a likelihood of overstressing a suspension flexure(s) supporting the proof mass. Without such a restriction of travel, when a displacement of the MEMS has a vector with a z-axis component (e.g., of acceleration) of sufficient magnitude, the proof mass may be displaced in the z-direction until a spring restoring force of the suspension flexure(s) is equal to a force caused by z-axis vector component of the displacement of the MEMS or a fracture stress force of the suspension flexure(s) may be reached or exceeded.

If the suspension flexure(s) does not break due to the fracture stress force being reached or exceeded, the spring restoring force of the suspension flexure(s) will accelerate the proof mass in an opposite z-axis direction. Displacement in the opposite z-axis direction may possibly cause the proof mass and/or electrodes connected to the proof mass to impact a surface of a stationary wafer of the MEMS and/or electrodes connected to the stationary wafer (e.g., an electronics wafer).

The out-of-plane travel restriction structures described in the present disclosure reduce the likelihood of the restricted displacement of the proof mass in the z-direction generating enough force to overcome the spring restoring force of the suspension flexure(s). In addition, the out-of-plane travel restriction structures reduce the likelihood of the restricted displacement of the proof mass in the z-direction generating enough spring restoring force in the suspension flexure(s) to displace the proof mass far enough in the opposite z-direction to impact the surface of a stationary wafer of the MEMS and/or the electrodes connected to the stationary wafer.

As used in this disclosure, the terms "wafer" and "substrate" are used interchangeably and are to be understood as including, but not limited to, silicon-on-insulator (SOI) or silicon-on-sapphire (SOS) technology, doped and undoped semiconductors, epitaxial layers of silicon supported by a base semiconductor foundation, and/or other semiconductor structures. Furthermore, when reference is made to a "wafer" or "substrate" in the following description, previous process steps may have been utilized to form regions, areas, or junctions in or on the semiconductor structure or foundation. Also, as used herein, "a number of" something can refer to one or more of such things.

FIGS. 1A-1E illustrate processing steps associated with forming out-of-plane travel restriction structures in accordance with an example of the present disclosure. A first wafer 100 illustrated in FIG. 1A includes a bond layer 101 bonded to a first surface of a first substrate material 105 and, in some examples, a second substrate material 107 bonded to a second surface of the first substrate material 105. In various examples, the bond layer can be formed from one or more dielectrics and/or silicon oxides and/or silicon carbides capable of bonding to a substrate material (e.g., formed from a silicon-containing material) upon which the bond layer is applied and/or to a material (e.g., a wafer formed from a silicon-containing material) that is applied to the bond layer.

As described herein, examples of the present disclosure accurately and precisely set a particular thickness of the bond layer to determine particular separation(s) in the z-direction of a proof mass (and electronic elements associated therewith) from stationary wafer(s) (and electronic elements associated therewith). For instance, the particular separation(s) can reduce the likelihood of collision between interacting electrode elements. Because the resulting particular separation(s) in the z-direction of the proof mass from the stationary wafer(s) can be set independently by adjusting the particular thickness of the bond layer, the likelihood of collision between interacting electrode elements, for example, can be flexibly and quickly adjusted to match different device performance requirements without other design, process, and/or structural changes, for example.

In some examples, the particular separation(s) in the z-direction of the proof mass from the stationary wafer(s) can be set independently by directly etching the out-of-plane travel restriction structures (e.g., z-axis structures such as bumpers, pillars, and/or shoulders, among other such structures) to a particular height without using an adjustable thickness bond layer. For example, such out-of-plane travel restriction structures can be formed using the masking techniques described herein without departing from the teachings of the present disclosure.

Figure 1A:
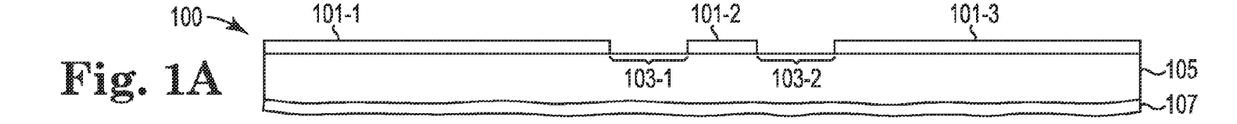
FIGS. 1A-1E illustrate processing steps associated with forming out-of-plane travel restriction structures in accordance with an example of the present disclosure.

In the example illustrated in FIG. 1A, the bond layer 101 can be applied and/or removed to form a number of portions (e.g., at 101-1, 101-2, and 101-3, as shown in profile) covered by the bond layer that are separated to create a number of exposed areas (e.g., at 103-1 and 103-2, as shown in profile) on the first surface of the first substrate material 105. In various examples, the number of exposed areas (e.g., at 103-1 and 103-2) can be formed by directed deposition of the bond layer 101 (e.g., using chemical vapor deposition (CVD), physical vapor deposition (PVD), or atomic layer deposition (ALD), among various other semiconductor processing techniques) accompanied by appropriate masking techniques and/or by directed removal of the bond layer (e.g., using etching techniques appropriate to the particular deposition technique(s) and/or the composition of the bond layer and/or other techniques, such as ablation).

Figure 1B:
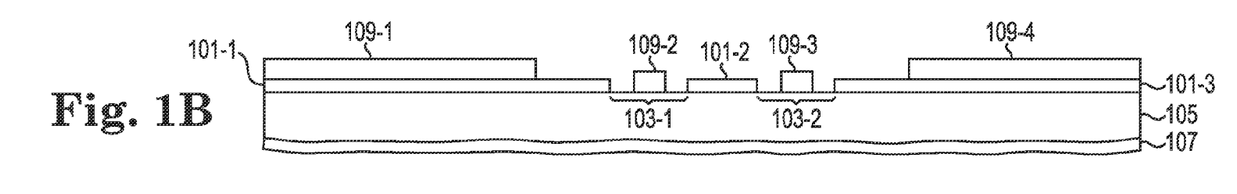

In the example illustrated in FIG. 1B, a mask 109 is applied to the bond layer 101. In profile, FIG. 1B shows that portion 109-1 of the mask can be applied to mask a portion 101-1 of the bond layer and a separate portion 109-4 of the mask can be applied to mask another portion 101-3 of the bond layer separated from portion 101-1 of the bond layer by portion 101-2 of the bond layer and the exposed areas 103-1,103-2 on the first surface of the first substrate material 105.

A portion 109-2 of the mask can be applied to at least a portion of the exposed area 103-1 of the first substrate material 105 between portions 101-1,101-2 of the bond layer. Another portion 109-3 of the mask can be applied to at least a portion of exposed area 103-2 of the first substrate material 105 between portions 101-2, 101-3 of the bond layer. In various examples, each of the different portions of the mask (e.g., portions 109-1 through 109-4) can be formed from the same masking material or each of the different portions of the mask can be formed, as appropriate, from different masking materials, or any variation thereof (e.g., portions 109-1 and 109-4 can be formed from the same masking material and portions 109-2 and 109-3 can be formed from the same masking material, albeit a different masking material than that used to form portions 109-1 and 109-4).

Figure 1C:
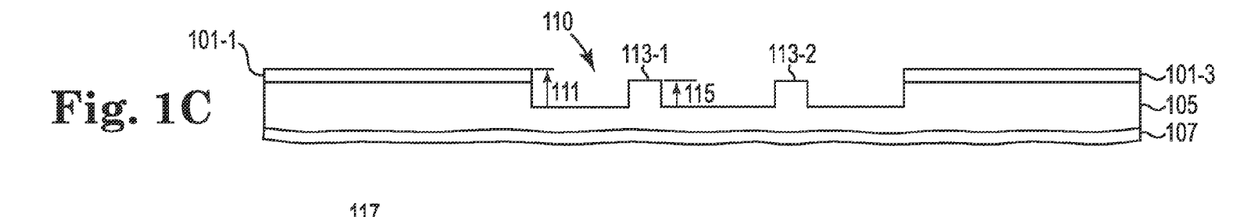

In the example illustrated in FIG. 1C, an etch is performed to form a cavity 110 of a particular depth 111 relative to remaining portions 101-1, 101-3 of the bond layer that were masked by the mask shown in FIG. 1 B. That is, the cavity 110 of the particular depth 111 is formed with outer walls contributed to by the first substrate material 105 and the remaining portions 101-1, 101-3 of the bond layer that were masked by the mask.

Etching with the portion 109-2 of the mask in place, which was previously applied to at least a portion of the exposed area 103-1 of the first substrate material 105 between portions 101-1, 101-2 of the bond layer, forms a first pillar 113-1 positioned toward a first side of the cavity (e.g., not positioned in the center of the cavity where portion 101-2 of the bond layer was previously positioned). Similarly, etching with the portion 109-3 of the mask in place, which was previously applied to at least a portion of exposed area 103-2 of the first substrate material 105 between portions 101-2, 101-3 of the bond layer, forms a second pillar 113-2 positioned toward a second side of the cavity (e.g., not positioned in the center of the cavity where portion 101-2 of the bond layer was previously positioned and distally positioned relative to the first pillar 113-1).

The portions 109-2, 109-3 of the mask are directly applied to the first surface of the first substrate material 105 without an intervening bond layer. Hence, the etch performed to form the cavity 110 of the particular depth 111, relative to remaining portions 101-1, 101-3 of the bond layer, forms the first pillar 113-1 and the second pillar 113-2 with a particular height 115 relative to the bottom of the cavity that differs from the particular depth 111. Accordingly, the particular height 115 of the pillars 113-1, 113-2 is less than the particular depth 111 of the cavity 110 by a distance substantially equal to the particular thickness of the bond layer 101.

The different portions (e.g., portions 109-1 through 109-4) of the mask can be removed to expose the top surface(s) of the remaining bond layer portions (e.g., portions 101-1, 101-3) and the top surface(s) of the pillars (e.g., pillars 113-1, 113-2) after etching has been performed to form the cavity 110. Removal of the different portions of the mask can be performed by various techniques appropriate to the type(s) of masking material applied and the different portions of the mask are not shown in FIG. 1C.

Figure 1D:
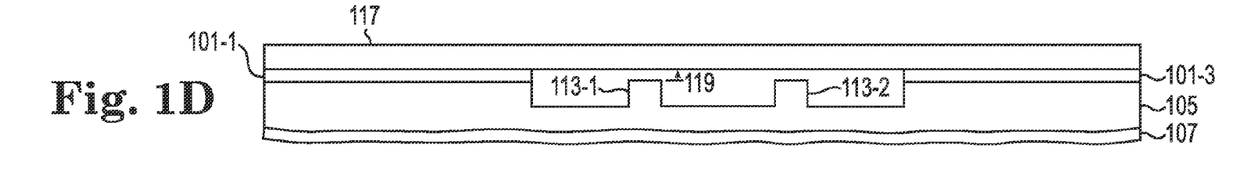

In the example illustrated in FIG. 1D, a second wafer 117 has been applied (e.g., bonded) to the top surfaces of the remaining portions (e.g., portions 101-1, 101-3) of the bond layer. As described elsewhere herein, the bond layer portions 101-1, 101-3 are formed from a material that is capable of bonding to a material (e.g., a wafer) that is applied to the bond layer. In some examples, the second wafer 117 is formed from a material suitable for forming a proof mass and associated structures (e.g., an M wafer) of a MEMS.

In the example illustrated in FIG. 1D, the top of the first pillar 113-1 is separated from an adjacent surface of the second wafer 117 by a particular distance 119. The particular distance 119 of separation of the top of the first pillar 113-1 from the adjacent surface of the second wafer 117 is the distance substantially equal to the particular thickness of the bond layer 101. Similarly, the separation of the adjacent surface of the second wafer 117 from the second pillar 113-2 is the distance substantially equal to the particular thickness of the bond layer 101.

Figure 1E:
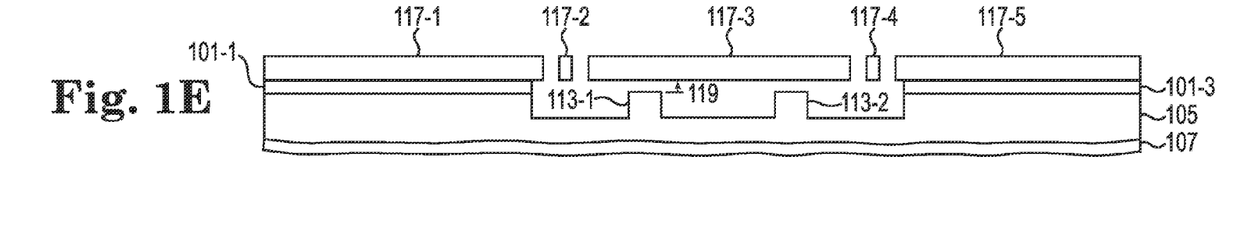

In the example illustrated in FIG. 1E, the second wafer 117 is shown in profile as etched to form a first portion 117-1 of an anchoring frame bonded to the remaining portion 101-1 of the bond layer on one side of the cavity 110 and a second portion 117-7 of the anchoring frame bonded to the remaining portion 101-3 of the bond layer on an opposite side of the cavity 110. The etch also forms from the second wafer 117 portions of suspension flexures 117-2, 117-4, as shown in profile, on each side of a proof mass 117-3 formed by the etch.

FIG. 1E is a middle cut view showing the structure in profile. As such, the portions 117-1, 117-5 of the anchoring frame, the portions of the suspension flexures 117-2, 117-4, and the proof mass 117-3 appear to be disconnected. However, the etch is performed such that the portions 117-1, 117-5 of the anchoring frame, the portions of the suspension flexures 117-2, 117-4, and the proof mass 117-3 are connected at at least one point on each side of the proof mass 117-3 to support the proof mass 117-3 over the cavity 110. As will be appreciated, in any particular cut profile view there can be more or less individual suspension flexures shown in profile than are shown in FIG. 1E depending upon where the cut is made. In addition, a top view of FIG. 1E would show, in various examples, that the anchoring frame can be formed from one or more pieces positioned around the cavity and that two or more suspension flexures can be connected to the proof mass and the suspension frame at positions around the perimeters of the proof mass and the suspension frame.

In the example illustrated in FIG. 1E, the proof mass 117-3 is supported over the cavity 110 by the portions 117-1, 117-5 of the anchoring frame and the suspension flexures 117-2, 117-4. The proof mass 117-3 is also suspended over the top of the first pillar 113-1. The top of the first pillar 113-1 is separated from an adjacent surface on one side of the proof mass 117-3 by the particular distance 119. The particular distance 119 of separation of the top of the first pillar 113-1 from the adjacent surface on one side of the proof mass 117-3 is the distance substantially equal to the particular thickness of the bond layer 101. Similarly, the particular distance 119 of separation of an adjacent surface on a substantially opposite side of the proof mass 117-3 from the second pillar 113-2 is the distance substantially equal to the particular thickness of the bond layer 101.

Accordingly, a MEMS device can be formed with a first wafer including a bond layer of a particular thickness on a surface of a first substrate material, where the bond layer is absent in a number of first areas to expose the surface of the first substrate material. A removable mask can be applied to cover at least a portion of a remaining bond layer and a portion of the exposed surface of the first substrate material in the number of first areas to form a number of uncovered second areas exposed on the surface of the first substrate material. A cavity can be formed by an etch in an uncovered portion of the remaining bond layer and the number of uncovered second areas of the first substrate material. In addition, a number of structures in the cavity can be formed by the etch for restricting out-of-plane travel of a proof mass (e.g., to the particular distance 119 of separation of the top of the pillars 113-1, 113-2 from the adjacent surface on one side of the proof mass 117-3), where each of the number of structures has a particular height from a bottom of the cavity determined by the particular thickness of the bond layer.

The particular thickness of the bond layer can be in a range of from 0.5 micrometer to 3.0 micrometers. The bond layer can be formed to the predetermined thickness with materials that are bondable to the first wafer that are selected from a group that includes dielectrics or metals that are deposited or that are thermally grown on the surface of the first wafer. In some examples, the bond layer can be formed from silicon dioxide that is deposited to the predetermined thickness by, for example, CVD or that is thermally grown on the surface of the first wafer.

The number of structures formed for restricting out-of-plane travel of the proof mass 117-3 can include a plurality of pillars (e.g., 113-1, 113-2) positioned in a central region of the cavity 110 interior to a periphery of the proof mass 117-3 (e.g., interior to the periphery of the proof mass at rest and/or interior to the periphery of the proof mass in a predetermined displacement range). The plurality of pillars (e.g., 113-1, 113-2) each can have the particular height in a range of from 25 micrometers to 450 micrometers and a particular width, corresponding to a width of the mask (e.g., 109-2, 109-3), in a range of from 150 micrometers to 250 micrometers.

FIGS. 2A-2E illustrate processing steps associated with forming out-of-plane travel restriction structures in accordance with another example of the present disclosure. A first wafer 220 illustrated in FIG. 2A includes a bond layer 221 bonded to a first surface of a first substrate material 225 and, in some examples, a second substrate material 227 bonded to a second surface of the first substrate material 225.

Figure 2A:
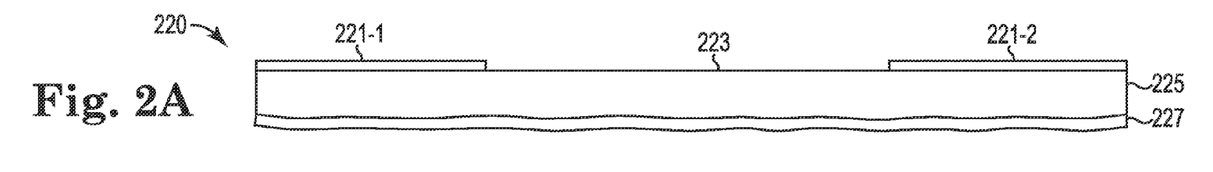
FIGS. 2A-2E illustrate processing steps associated with forming out-of-plane travel restriction structures in accordance with another example of the present disclosure.

In the example illustrated in FIG. 2A, the bond layer 221 can be applied and/or removed to form a number of portions (e.g., at 221-1 and 221-2, as shown in profile) covered by the bond layer that are separated to create an exposed area (e.g., at 223, as shown in profile) on the first surface of the first substrate material 225. In various examples as described herein, the exposed area (e.g., at 223) can be formed by directed deposition of the bond layer 101 accompanied by appropriate masking techniques and/or by directed removal of the bond layer.

Figure 2B:
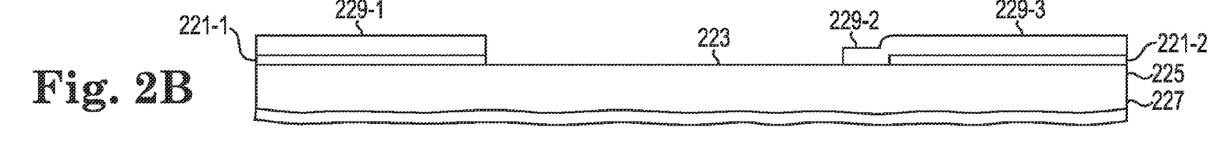

In the example illustrated in FIG. 2B, a mask 229 is applied to one or more of the portions 221-1, 221-2 of the bond layer. In profile, FIG. 2B shows that a first portion 229-1 of the mask can be applied to mask a portion 221-1 of the bond layer on one side of the exposed area 223 and a separate second portion 229-3 of the mask can be applied to mask another portion 221-2 of the bond layer separated from the portion 221-1 of the bond layer by the exposed area on the first surface of the first substrate material 225. A third portion 229-2 of the mask can be applied to at least one portion of the exposed area 223 of the first substrate material 225 adjacent the portions 221-1, 221-2 of the bond layer (e.g., adjacent portion 221-2 of the bond layer in FIG. 2B).

Figure 2C:
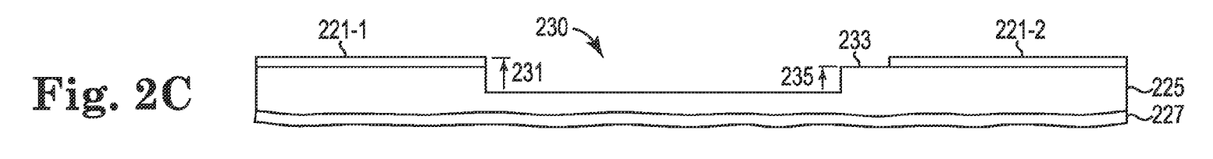

In the example illustrated in FIG. 2C, an etch is performed to form a cavity 230 of a particular depth 231 relative to portions 221-1, 221-2 of the bond layer that were masked by the mask shown in FIG. 2B. That is, the cavity 230 of the particular depth 231 can be formed with an outer wall contributed to by the first substrate material 225 and a remaining portion 221-1 of the bond layer that was masked by the mask.

Etching with the mask 229-2 in place, which was previously applied to at least a portion of exposed area 223 of the first substrate material 225 adjacent portion 221-2 of the bond layer, forms a first shoulder 233 positioned on a first side of the cavity 230 (e.g., positioned adjacent to portion 221-2 of the bond layer) as shown in profile. In various examples, one or more additional shoulders can be formed in the cavity 230 adjacent portions of the bond layer (e.g., adjacent portion 221-1 of the bond layer in FIG. 2B) masked by the mask.

The portion 229-2 of the mask is directly applied to the first surface of the first substrate material 225 in exposed area 223 without an intervening bond layer. Hence, the etch performed to form the cavity 230 of the particular depth 231, relative to remaining portions 221-1, 221-2 of the bond layer forms the first shoulder 233 (and potentially one or more additional shoulders) with a particular height 235 relative to the bottom of the cavity that differs from the particular depth 231. Accordingly, the particular height 235 of the shoulder 233 is less than the particular depth 231 of the cavity 230 by a distance substantially equal to the particular thickness of the bond layer 221.

The different portions (e.g., portions 229-1, 229-2, 229-3) of the mask can be removed to expose the top surface of the remaining bond layer portions (e.g., portions 221-1, 221-2) and the top surface of the shoulder(s) (e.g., shoulder 233) after etching has been performed to form the cavity 230. Removal of the different portions of the mask can be performed by various techniques appropriate to the type(s)

of masking material applied and the different portions of the mask are not shown in FIG. 2C.

Figure 2D:
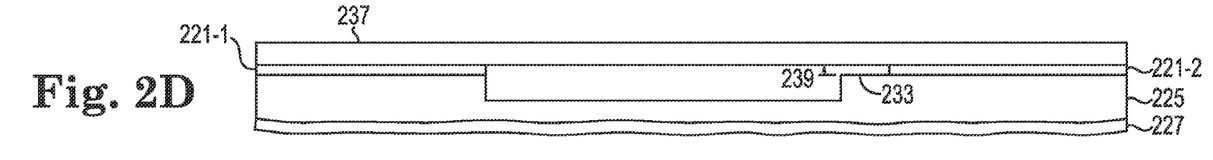

In the example illustrated in FIG. 2D, a second wafer 237 is applied (e.g., bonded) to the top surfaces of the remaining portions 221-1, 221-2 of the bond layer. As described elsewhere herein, the remaining portions 221-1, 221-2 of the bond layer are formed from a material that is capable of bonding to a material (e.g., a wafer) that is applied to the bond layer. In some examples, the second wafer 237 is formed from a material suitable for forming a proof mass and associated structures (e.g., an M wafer) of a MEMS.

In the example illustrated in FIG. 2D, the top of the shoulder 233 is separated from an adjacent surface of the second wafer 237 by a particular distance 239. The particular distance 239 of separation of the top of the first shoulder 233 from the adjacent surface of the second wafer 237 is the distance substantially equal to the particular thickness of the bond layer 221. Similarly, the separation of the adjacent surface of the second wafer 237 from a second or additional shoulders is the distance substantially equal to the particular thickness of the bond layer 221.

Figure 2E:
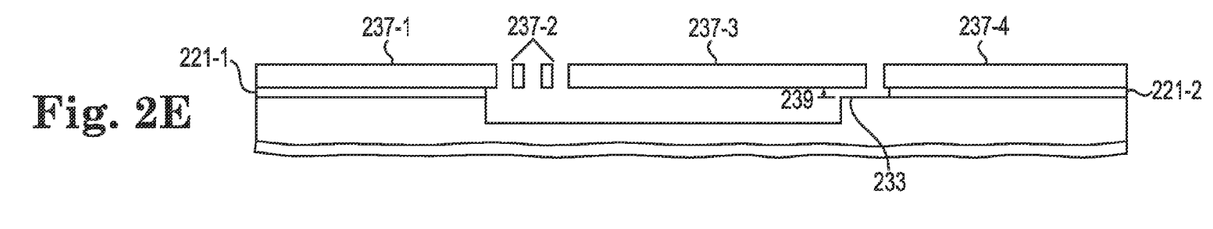

In the example illustrated in FIG. 2E, the second wafer 237 is shown in profile as etched to form a first portion 237-1 of an anchoring frame bonded to the remaining portion 221-1 of the bond layer on one side of the cavity 230 and a second portion 237-4 of the anchoring frame bonded to the remaining portion 221-2 of the bond layer on an opposite side of the cavity 230. The etch also forms from the second wafer 237 elements 237-2 of a suspension flexure, as shown in profile, on one side of a proof mass 237-3 along with the proof mass 237-3.

FIG. 2E is a middle cut view showing the structure in profile. As such, the portions 237-1, 237-4 of the anchoring frame, the elements 237-2 of the suspension flexure, and the proof mass 237-3 appear to be disconnected. However, the etch is performed such that the portions 237-1, 237-4 of the anchoring frame, the elements 237-2 of the suspension flexure, and the proof mass 237-3 are each connected at at least one point to support the proof mass 117-3 over the cavity 230. As will be appreciated, in any particular cut profile view there can be more or less individual suspension flexures shown in profile than are shown in FIG. 1E depending upon where the cut is made. Accordingly, for clarity, only one suspension flexure is shown in FIG. 2E on one side of the proof mass 237-3. However, at least one additional suspension flexure can be included to suspend at least the other side of the proof mass. In addition, a top view of FIG. 2E would show, in various examples, that the anchoring frame can be formed from one or more portions positioned around the cavity and that two or more suspension flexures can be connected to the proof mass and the suspension frame at positions around the perimeters of the proof mass and the suspension frame.

In the example illustrated in FIG. 2E, the proof mass 237-3 is supported over the cavity 230 by the portions 237-1, 237-4 of the anchoring frame and the elements 237-2 of the suspension flexure. The proof mass 237-3 is also suspended over the top of the first shoulder 233. The top of the first shoulder 233 is separated from an adjacent surface on one side of the proof mass 237-3 by the particular distance 239. The particular distance 239 of separation of the top of the first shoulder 233 from the adjacent surface on one side of the proof mass 237-3 is the distance substantially equal to the particular thickness of the bond layer 221. Similarly, a particular distance of separation of an adjacent surface on a substantially opposite side of the proof mass from a second pillar (not shown) would be the distance substantially equal to the particular thickness of the bond layer.

Accordingly, a MEMS device can be formed with a first wafer including a bond layer of a particular thickness on a surface of a first substrate material, where the bond layer is absent in a central area of the first substrate material to expose the surface of the first substrate material. A mask can be applied to cover all of a remaining bond layer and cover an adjacent portion of the exposed surface of the first substrate material in the central area to form an uncovered second area exposed on the surface of the first substrate material. A cavity can be formed by an etch in the uncovered second area of the first substrate material. In addition, a number of shoulders in the cavity can be formed by the etch for restricting out-of-plane travel of a proof mass (e.g., to the particular distance 239 of separation of the top of the shoulder 233 from the adjacent surface on one side of the proof mass 237-3), where each of the number of shoulders has a particular height from a bottom of the cavity determined by the particular thickness of the bond layer. In various examples, the number of shoulders formed for restricting out-of-plane travel each can include a particular width at the periphery of the cavity in a range of from 150 micrometers to 250 micrometers to overlap a boundary of the proof mass while in a rest position.

As described in the present disclosure and illustrated with regard to FIGS. 1A-1E and 2A-2E, out-of-plane travel restriction structures are formed by providing a first wafer comprising a bond layer of a particular thickness on a surface of a first substrate material. Forming the out-of-plane travel restriction structures includes removing the bond layer in a first area to expose the surface of the first substrate material and applying a mask to at least a portion of a remaining bond layer and a portion of the exposed surface of the first substrate material in the first area to form a second area exposed on the surface of the first substrate material. Forming the out-of-plane travel restriction structures includes etching the second area to form a cavity in the first substrate material and the bond layer and forming by the etching, in the cavity, the structure for restricting out-of-plane travel, where the structure has a particular height from a bottom of the cavity determined by the particular thickness of the bond layer.

Forming the out-of-plane travel restriction structures can, in various examples, include the cavity having a particular depth determined from the bottom of the cavity to a top surface of the bond layer. The particular height of the structure from the bottom of the cavity can be determined by determining a difference between the particular thickness of the bond layer and the particular depth of the cavity. Forming the out-of-plane travel restriction structures can, in various examples, include removing the mask to expose a top surface of the bond layer and a top of the structure for restricting out-of-plane travel and bonding a second wafer to the top surface of the bond layer.

Forming the out-of-plane travel restriction structures can, in various examples, include forming for a MEMS a proof mass, a flexure suspension, and an anchoring frame by etching through the second wafer. The MEMS can include using electrodes for detecting movement of the proof mass from a resting position in an xy plane of the second wafer by capacitive coupling. Forming the out-of-plane travel restriction structures can, in various examples, include restricting the out-of-plane travel of the proof mass in a z direction such that the travel is restricted to the particular thickness of the bond layer by the particular height of the structure.

Figure 3:
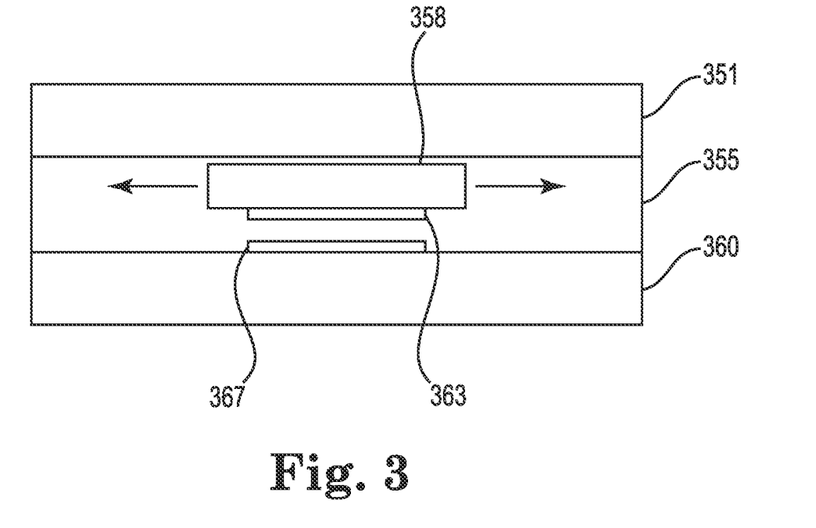
FIG. 3 is a schematic illustrating a MEMS sensor including a bonded wafer structure according to an example of the present disclosure.

FIG. 3 is a schematic illustrating a MEMS sensor including a bonded wafer structure according to an example of the present disclosure. As an example, the MEMS sensor illustrated in FIG. 3 can be a capacitive sensor used to detect various physical quantities including position, proximity, acceleration, flow, and/or pressure, among various other physical quantities. In various examples, the capacitive sensor can be formed as a structure intended to primarily detect displacement vectors having x- and/or z-axis components rather than a z-axis component of the displacement vectors.

As such, as described in the present disclosure, various out-of-plane travel restriction structures can be provided to reduce the magnitude and/or force of the z-axis component of the displacement vectors. In this example, the MEMS sensor includes three physical structures (e.g., wafers) with the various configurations of the out-of-plane travel restriction structures and cavities not being shown. The structures include a cap wafer 351, a proof mass wafer 355 (e.g., an M wafer) from which a proof mass 358 can be formed, and an electronics wafer 360. The schematic example illustrated in FIG. 3 shows the cap wafer and the proof mass wafer in an inverted position relative to the positions of the cap wafers and the proof mass wafers shown in FIGS. 1D-1E and 2D-2E.

The electronics wafer 360 can include CMOS electronics (not shown) and may be electrically coupled to various electrical components in the proof mass wafer 355 and/or the proof mass 358 and/or the cap wafer 351. The electronics wafer 360 can also provide input/output ports (not shown) for coupling to electronic components external to the MEMS sensor.

Although not shown in FIG. 3, the proof mass wafer 355 can include anchoring frame(s) and a number of suspension flexures mechanically coupled to the proof mass 358. As such, the proof mass 358 can be suspended above the electronics wafer 360 and can move primarily laterally with respect to the electronics wafer 360 as a result of the out-of-plane travel restriction structures.

In various examples, a first electrode array 363 can be formed on the proof mass 358. The first electrode array 363 can include a number of sensing and/or actuating elements (e.g., electrodes) for capacitive sensing of displacement. A second electrode array 367 can be formed on the electronics wafer 360. The second electrode array 367 can include a number of sensing and/or actuating elements (e.g., electrodes) for capacitive sensing of displacement. As illustrated in FIG. 3, the MEMS sensor is configured such that the first and second electrode arrays 363, 367 face each other and are separated by a particular element gap.

As described in the present disclosure, the out-of-plane travel restriction structures can reduce the likelihood of the restricted displacement of the proof mass in the z-direction generating enough force to overcome the spring restoring force of the suspension flexure(s) and/or impact the cap wafer. In addition, the out-of-plane travel restriction structures can reduce the likelihood of the restricted displacement of the proof mass in the z-direction generating enough spring restoring force in the suspension flexure(s) to displace the proof mass far enough in the opposite z-direction to impact the surface of electronics wafer and/or the electrodes connected to the electronics wafer.

In operation, the MEMS sensor can be affixed to various structures such as a vehicle, a mobile device, a computer, or any other structure that may experience a position change that one desires to quantify (e.g., a change in acceleration). The movement of the electrodes of arrays 363, 367 with respect to each other results in variances in cross capacitance between the arrays, for instance. These capacitance variances can be sensed by electronics within electronics wafer 360 and/or external to the MEMS sensor, for example. Such circuitry can provide output signals proportional to the acceleration change, for example, experienced by the MEMS sensor.

Although specific examples have been illustrated and described herein, one of ordinary skill in the art will appreciate that an arrangement calculated to achieve the same results can be substituted for the specific examples shown. This disclosure is intended to cover adaptations or variations of one or more examples of the present disclosure. It is to be understood that the above description has been made in an illustrative fashion, and not a restrictive one.

Combination of the above examples, and other examples not specifically described herein, will be apparent to one of ordinary skill in the art upon reviewing the above description. The scope of the one or more examples of the present disclosure includes other applications in which the above structures and methods are used. Therefore, the scope of one or more examples of the present disclosure should be determined with reference to the appended claims, along with the full range of equivalents to which such claims are entitled.

In the foregoing Detailed Description, some features are grouped together in a single example for the purpose of streamlining the disclosure. This method of disclosure is not to be interpreted as reflecting an intention that the disclosed examples of the present disclosure have to use more features than are expressly recited in each claim. Rather, as the following claims reflect, inventive subject matter lies in less than all features of a single disclosed example. Thus, the following claims are hereby incorporated into the Detailed Description, with each claim standing on its own as a separate example.

What is claimed:

1. A method of forming a structure for restricting out-of-plane travel, the method comprising:
   providing a first wafer comprising a bond layer of a particular thickness on a surface of a first substrate material;
   removing the bond layer in a first area to expose the surface of the first substrate material;
   applying a mask to at least a portion of a remaining bond layer and a portion of the exposed surface of the first substrate material in the first area to form a second area exposed on the surface of the first substrate material;
   etching the second area to form a cavity in the first substrate material and the bond layer; and
   forming by the etching, in the cavity, the structure for restricting out-of-plane travel, wherein the structure has a particular height from a bottom of the cavity determined by the particular thickness of the bond layer.

2. The method of claim 1, including the cavity having a particular depth determined from the bottom of the cavity to a top surface of the bond layer.

3. The method of claim 2, including determining the particular height of the structure from the bottom of the cavity by determining a difference between the particular thickness of the bond layer and the particular depth of the cavity.

4. The method of claim 1, including removing the mask to expose a top surface of the bond layer and a top of the structure for restricting out-of-plane travel.

5. The method of claim 4, including bonding a second wafer to the top surface of the bond layer.

6. The method of claim 5, including forming, for a microelectromechanical structure (MEMS), a proof mass, a flexure suspension, and an anchoring frame by etching through the second wafer.

7. The method of claim 6, including using electrodes for detecting movement of the proof mass from a resting position in an xy plane of the second wafer by capacitive coupling.

8. The method of claim 7, including restricting the out-of-plane travel of the proof mass in a z direction such that the travel is restricted to the particular thickness of the bond layer by the particular height of the structure.

9. A microelectromechanical structure (MEMS), comprising:
   a wafer comprising a bond layer of a particular thickness on a surface of a first substrate material, wherein the bond layer is absent in a number of first areas to expose the surface of the substrate material;
   a removable mask applied to cover at least a portion of a remaining bond layer and a portion of the exposed surface of the substrate material in the number of first areas to form a number of uncovered second areas exposed on the surface of the substrate material;
   a cavity formed by an etch in an uncovered portion of the remaining bond layer and the number of uncovered second areas of the substrate material; and
   a number of structures in the cavity formed by the etch for restricting out-of-plane travel of a proof mass,
   wherein each of the number of structures has a particular height from a bottom of the cavity determined by the particular thickness of the bond layer.

10. The MEMS of claim 9, wherein the particular thickness of the bond layer is in a range of from 0.5 micrometer to 3.0 micrometers.

11. The MEMS of claim 9, wherein the bond layer is formed to a predetermined thickness with materials that are bondable to the first wafer that are selected from a group that includes dielectrics or metals that are deposited or thermally grown on the surface of the first wafer.

12. The MEMS of claim 9, wherein the number of structures formed for restricting out-of-plane travel of the proof mass include a plurality of pillars positioned in a central region of the cavity interior to a periphery of the proof mass.

13. The MEMS of claim 12, wherein the plurality of pillars each have the particular height in a range of from 25 micrometers to 450 micrometers and a particular width, corresponding to a width of the mask, in a range of from 150 micrometers to 250 micrometers.

14. A microelectromechanical structure (MEMS), comprising:
   a wafer comprising a bond layer of a particular thickness on a surface of a substrate material, wherein the bond layer is absent in a central area of the first wafer to expose the surface of the substrate material;
   a mask applied to cover all of a remaining bond layer and cover an adjacent portion of the exposed surface of the substrate material in the central area to form an uncovered second area exposed on the surface of the substrate material;
   a cavity formed by an etch in the uncovered second area of the substrate material; and
   a number of shoulders in the cavity formed by the etch for restricting out-of-plane travel of a proof mass, wherein each of the number of shoulders has a particular height from a bottom of the cavity determined by the particular thickness of the bond layer.

15. The MEMS of claim 14, wherein the number of shoulders formed for restricting out-of-plane travel each includes a particular width at the periphery of the cavity in a range of from 150 micrometers to 250 micrometers to overlap a boundary of the proof mass while in a rest position.

* * * * *

UNITED STATES PATENT AND TRADEMARK OFFICE
CERTIFICATE OF CORRECTION

PATENT NO. : 9,571,008 B2
APPLICATION NO. : 14/112091
DATED : February 14, 2017
INVENTOR(S) : Donald J. Milligan et al.

It is certified that error appears in the above-identified patent and that said Letters Patent is hereby corrected as shown below:

On the Title Page

Item (54) and in the Specification, in Column 1, Line 1, Title, delete "OUT-OF PLANE" and insert -- OUT-OF-PLANE --, therefor.

Signed and Sealed this
Twenty-seventh Day of June, 2017

Joseph Matal
*Performing the Functions and Duties of the*
*Under Secretary of Commerce for Intellectual Property and*
*Director of the United States Patent and Trademark Office*